United States Patent
Fukano et al.

(10) Patent No.: US 7,040,679 B2
(45) Date of Patent: May 9, 2006

(54) VACUUM SUCTION DEVICE AND DRIVING METHOD THEREOF

(75) Inventors: Yoshihiro Fukano, Tsukuba-gun (JP); Shoichi Makado, Tsukuba-gun (JP)

(73) Assignee: SMC Corporation, Tokyo (JP)

( * ) Notice: Subject to any disclaimer, the term of this patent is extended or adjusted under 35 U.S.C. 154(b) by 266 days.

(21) Appl. No.: 10/654,012

(22) Filed: Sep. 4, 2003

(65) Prior Publication Data

US 2004/0046405 A1   Mar. 11, 2004

(30) Foreign Application Priority Data

Sep. 10, 2002  (JP) ............................. 2002-264586

(51) Int. Cl.
*A47J 45/00*   (2006.01)
(52) U.S. Cl. .................................... 294/64.1
(58) Field of Classification Search .............. 294/64.1, 294/64.2, 64.3; 414/752.1, 737, 627, 621; 901/40; 137/625.65
See application file for complete search history.

(56) References Cited

U.S. PATENT DOCUMENTS 5,059,088 A * 10/1991 Klein .......................... 414/627

* cited by examiner

*Primary Examiner*—Eileen D. Lillis
*Assistant Examiner*—Esther Oyinyechi Okezie
(74) *Attorney, Agent, or Firm*—Oblon, Spivak, McClelland, Maier & Neustadt, P.C.

(57) ABSTRACT

In a suction device, a suction head is alternately connected to a negative pressure source and a positive pressure source by means of a switching valve, a light-weight workpiece is sucked by and released from the suction head. When the suction head and the positive pressure source are connected to each other by means of the switching valve to release the workpiece, a releasing pressure is instantaneously supplied to the suction head. The magnitude of the releasing pressure is set to a value equal to or less than the atmospheric pressure and set to a value which is necessary for the workpiece to drop by its own weight from the suction head.

13 Claims, 1 Drawing Sheet

VACUUM SUCTION DEVICE AND DRIVING METHOD THEREOF

TECHNICAL FIELD

The present invention relates to a vacuum suction device and a driving method thereof suitable for sucking and transporting a small and light-weighted workpiece such as an electronic chip part, especially a light-weighted workpiece of 5 g or less.

BACKGROUND ART

In a tester used in a post process of semiconductor manufacturing process or an actual mounting device, a vacuum suction device is frequently used for transporting an electronic chip part. In this day, advances in miniaturization and weight reduction increase cases in which an electronic chip part of 20 g or less is handled, and in some cases, extremely light-weighted electronic chip part of about 0.1 g is frequently used. Therefore, the desire to shorten the response time and to enhance the precision of a suction device is increasing.

FIG. 2 shows a vacuum suction device 1 for sucking and transporting such an electronic chip part. The suction device 1 comprises a suction head 2 for sucking an electronic chip part W using negative pressure, a negative pressure source 3 comprising a vacuum pump or the like, a positive pressure source 6 having a positive pressure generating mechanism 6a such as a booster pump and a pressure reducing valve 6b, and a double solenoid-type electromagnetic valve 7 of three position closed center type which selectively brings the negative pressure source 3 and the positive pressure source 6 into communication with the suction head 2. A passage 8 between the positive pressure source 6 and the electromagnetic valve 7 includes a throttle device 9 such as a throttle valve. A passage 10 between the electromagnetic valve 7 and the suction head 2 includes a suction filter 10a for removing dust in the air.

When the suction device 1 transports the electronic chip part W, the electromagnetic valve 7 is first switched over to bring the negative pressure source 3 and the suction head 2 into communication with each other, and the suction head 2 is allowed to suck the electronic chip part W. Then, the electronic chip part W is transported to a destination. After that, in order to separate the electronic chip part W from the suction head 2, the electromagnetic valve 7 is switched over to bring the positive pressure source 6 and the suction head 2 into communication with each other. However, if a positive pressure is supplied into the suction head 2 from the positive pressure source 6, even if the pressure is low, since the electronic chip part W which is reduced in size and weight is blown off from the suction head 2 or a position of the electronic chip part W is deviated, the electronic chip part W can not be supplied to a correct position.

In order prevent such a situation, it seems to be a good idea to sufficiently reduce a flow rate of positive pressure air using the throttle device 9 or to introduce atmospheric air instead of the positive pressure source 6. However, since it takes time until pressure acting on the suction head 2 rises, delay is generated in response time from the instant when the electromagnetic valve 7 is switched to the instant when the electronic chip part W is separated from the suction head 2.

Thereupon, in the vacuum suction device 1 shown in FIG. 2, the electromagnetic valve 7 is switched to a central position immediately before the pressure acting on the suction head 2 reaches a pressure near the atmospheric pressure, and a positive pressure and a negative pressure supplied to the suction head 2 are completely interrupted.

In the conventional vacuum suction device 1, however, the electromagnetic valve 7 of three position closed center type is required, and two solenoids are required to switch the valve and thus, the costs are increased. Further, it is extremely difficult to adjust the switching timing of the electromagnetic valve 7 to the central position and the throttle device 9 and the like while keeping balance therebetween such that the electronic chip part W is precisely separated without generating a delay in the response time.

DISCLOSURE OF THE INVENTION

The present invention has been accomplished in view of the problem, and it is an object of the invention to provide a vacuum sucking technique capable of simplifying its structure and control to reduce its cost, and capable of separating a workpiece from the suction head with accuracy without generating a delay in the response time even if the workpiece is small in size and light in weight.

To achieve the above object, the present invention provides a vacuum suction device comprising a suction head for sucking a workpiece, a negative pressure source and a positive pressure source, a single switching valve for selectively connecting the negative pressure source and the positive pressure source to the suction head, a first passage for connecting the switching valve and the suction head with each other, a second passage for connecting the switching valve and the negative pressure source with each other, a third passage for connecting the switching valve and the positive pressure source with each other, and a throttle device provided in the third passage, wherein the switching valve is a two position valve comprising a first switching position which interrupts the third passage and connects the first passage and the second passage with each other, and a second switching position which interrupts the second passage and connects the first passage and the third passage, and wherein a total volume in the first passage is defined as V1, total volume of a main passage portion from the throttle device in the third passage to the switching valve is defined as V2, a negative pressure in the first passage when the workpiece is sucked by the suction head is defined as P1, a positive pressure of the main passage portion when the work piece is sucked is defined as P2, and an internal pressure of the first passage and the main passage portion immediately after the switching valve is switched in a state in which the workpiece is sucked by the suction head and the first passage and the third passage are brought into communication with each other is defined as Ps, in the following equation, $$P1 \times V1 + P2 \times V2 = Ps \times (V1 + V2)$$

The pressures P1 and P2, as well as passage volumes V1 and V2 are associated with each other such that the Ps is equal to or less than the atmospheric pressure which is necessary for the workpiece to drop by its own weight from the suction head.

According to the suction device of the invention, if the switching valve is switched into the first switching position in order to release the workpiece sucked by the suction head, a pressure charged in the main passage portion instantaneously flows into the first passage. Therefore, the internal pressure in the first passage and the main passage portion becomes a predetermined releasing pressure, and the workpiece is instantaneously released. Since the releasing pressure at that time is equal to or less than the atmospheric pressure, even if the workpiece is light-weighted, the workpiece is not blown off by the releasing pressure. Thereafter, since a positive pressure from the positive pressure source is supplied, little by little, through the throttle device, a pressure in the suction head becomes slightly higher than the atmospheric pressure, but since the workpiece has already been released by that time, this pressure does not affect the release of the workpiece. When the first passage is provided with the suction filter, the positive pressure flow cleans the suction filter, and this is of use in removing clogging.

In the present invention, a tank for increasing a volume of the main passage portion can be connected to the main passage portion of the second passage. The first passage can be provided with a suction filter.

The switching valve used in this invention is a single solenoid type two position electromagnetic valve.

The present invention also provides a driving method using the above vacuum suction device, wherein the method comprises a first step for connecting the first passage and the second passage by means of the switching valve, thereby sucking the workpiece by the suction head and transporting the workpiece, and a second step for bringing the first passage and the third passage into communication with each other by means of the switching valve, thereby supplying a releasing pressure into the suction head and releasing the workpiece from the suction head, in the second step, a positive pressure charged in the main passage portion extending from a throttle device of the third passage to the switching valve flows into the first passage immediately after the first passage and the third passage are brought into communication with each other by the switching valve, thereby obtaining the releasing pressure, and magnitude of the releasing pressure is set to a value equal to or less than the atmospheric pressure and set to a value which is necessary for the workpiece to drop by its own weight from the suction head.

In the driving method of the invention, a total volume in the first passage is defined as V1, a total volume of the main passage portion is defined as V2, a negative pressure in the first passage when the workpiece is sucked by the suction head is defined as P1, a positive pressure of the main passage portion when the workpiece is sucked is defined as P2, and the releasing pressure is defined as Ps, the pressures P1 and P2, as well as passage volumes V1 and V2 are set such that the following equation is established:

$$P1 \times V1 + P2 \times V2 = Ps \times (V1 + V2).$$

DETAILED DESCRIPTION OF THE INVENTION

Figure 1:
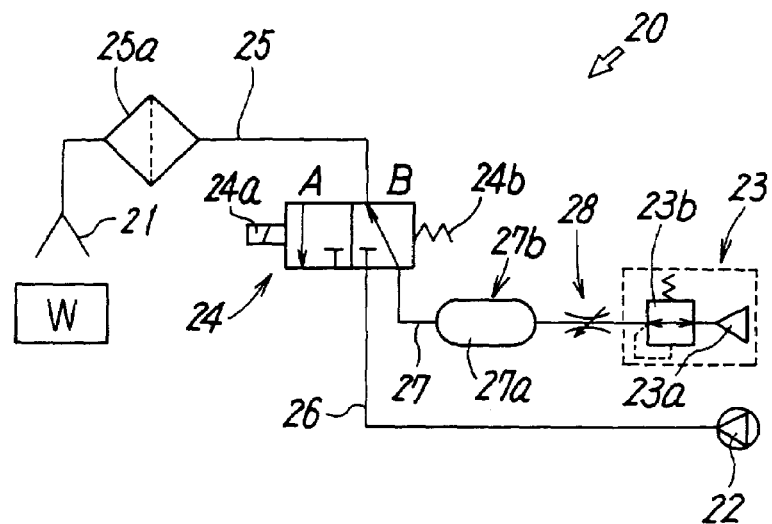
FIG. 1 is a schematic diagram showing one embodiment of a vacuum suction device according to the present invention.
Figure 2:
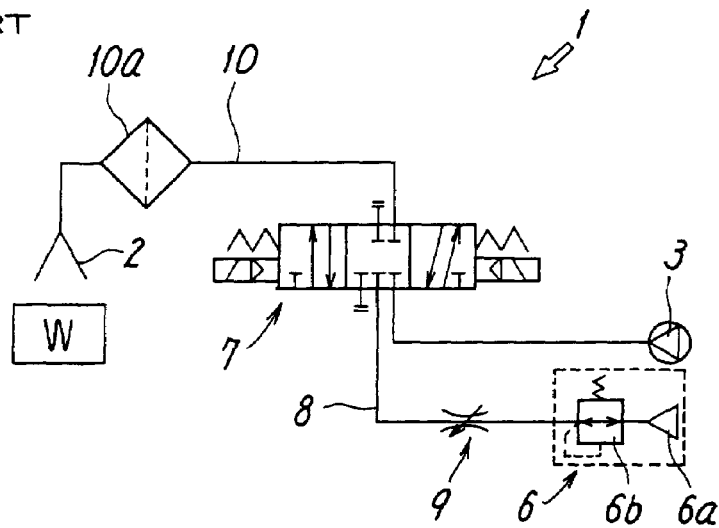
FIG. 2 is a schematic diagram showing a conventional vacuum suction device.

An embodiment of a vacuum suction device 20 according to the present invention will be explained using FIG. 1. The suction device 20 is for sucking a small and light-weighted workpiece W and transporting the same to a destination. The suction device 20 comprises an suction head 21 for sucking the workpiece W, a negative pressure source 22 for supplying negative pressure to this suction head 21, a positive pressure source 23 for supplying positive pressure to the suction head 21, and one switching valve 24 for selectively connecting the negative pressure source 22 and the positive pressure source 23 to the suction head 21. The workpiece W is as light as 5 g or less, or about 1 g in some cases.

The suction head 21 is directly connected to the switching valve 24 by a first passage 25 without through another switching valve. The negative pressure source 22 and the positive pressure source 23 are directly connected to the switching valve 24 by second passage 26 and third passage 27 respectively without through another switching valve.

In the suction device 20, after the workpiece W is transferred to the destination by the suction head 21, the workpiece W is separated from the suction head 21 in a state in which the suction head 21 is directed downward.

The switching valve 24 is a single solenoid type two position three port electromagnetic valve. The switching valve 24 is switched between an illustrated second switching position B and a first switching position A located in the opposite side by function of a solenoid 24a and a return spring 24b. In the second switching position B, the second passage 26 which is in communication with the negative pressure source 22 is interrupted, and the third passage 27 which is in communication with the positive pressure source 23 and the first passage 25 which is in communication with the suction head 21 are brought into communication with each other. In the first switching position A, the third passage 27 which is in communication with the positive pressure source 23 is interrupted, and the second passage 26 which is in communication with the negative pressure source 22 and the first passage 25 are brought into communication with each other.

The negative pressure source 22 comprises a vacuum pump or other negative pressure generating mechanism, and can supply negative pressure of necessary level. The positive pressure source 23 comprises a positive pressure supplying section 23a such as a booster pump and a pressure reducing valve 23b for adjusting pressure, and the positive pressure source 23 can supply positive pressure of necessary level.

A variable throttle device 28 comprising a throttle valve or the like for adjusting a supply amount of positive pressure air from the positive pressure source 23 is provided in the third passage 27 which connects the switching valve 24 and the positive pressure source 23. A tank 27a for increasing a volume of the third passage 27 to a necessary level is provided between the throttle device 28 and the switching valve 24. A suction filter 25a for removing dust is provided in the first passage 25 which connects the switching valve 24 and the suction head 21 with each other. When the negative pressure source 22 is in communication with the suction head 21 and the negative pressure is acting on the suction head 21, dust in the air drawn by the suction head 21 is removed by this suction filter 25a.

The workpiece W is transferred by the suction device 20 through two steps, i.e., a first step and a second step. In the first step, the solenoid 24a is energized to switch the switching valve 24 into the first switching position A located on the opposite side from that shown in FIG. 1, the first passage 25 and the second passage 26 on the side of the negative pressure source 22 are connected to each other, thereby sucking the workpiece by the suction head 21 and transporting the same. In the second step, the solenoid 24a is turned off to switch the switching valve 24 into the illustrated second switching position B by a spring force of the return spring 24b, the first passage 25 and the third passage 27 are brought into communication with each other to supply a releasing pressure to the suction head 21, thereby releasing the workpiece W from the suction head 21. By repeating the both steps, a plurality of workpieces is supplied to the destination one after another.

Here, a total volume including the suction filter 25a in the first passage 25 is defined as V1, a total volume including the tank 27a of a main passage portion 27b from the throttle device 28 in the third passage 27 to the switching valve 24 is defined as V2, a negative pressure in the first passage 25 when the workpiece is sucked by the suction head 21 is defined as P1, a positive pressure of the main passage portion 27b when the workpiece is sucked is defined as P2, and an internal pressure of the first passage 25 and the main passage portion 27b immediately after the switching valve 24 is switched into the second switching position B in a state in which the workpiece is sucked by the suction head 21 and the first passage 25 and the third passage 27 are brought into communication with each other is defined as Ps. In the following equation, $$P1 \times V1 + P2 \times V2 = Ps \times (V1 + V2)$$

the pressures P1 and P2, as well as passage volumes V1 and V2 are associated with each other such that the Ps is equal to or less than the atmospheric pressure which is necessary for the workpiece W to drop by its own weight from the suction head 21, and the Ps is not substantially increased further.

With this design, when the first passage 25 and the third passage 27 are brought into communication with each other by the switching valve 24 in the second step, a pressure charged into the main passage portion 27b of the third passage 27 flows into the first passage 25, a pressure in the suction head 21 instantaneously reaches a pressure Ps which is necessary to release the workpiece W, i.e., a releasing pressure. Since the releasing pressure at that time is substantially the same or slightly lower than the atmospheric pressure, even if the workpiece is light-weighted, the workpiece is not blown off by the releasing pressure.

After the workpiece W is released, positive pressure air from the positive pressure source 23 is supplied, little by little, to the suction head 21 through the throttle device 28. Therefore, a pressure in the suction head 21 becomes slightly higher than the atmospheric pressure, but since the workpiece has already been released by that time, this pressure does not affect the release of the workpiece. Rather, the flow of the positive pressure air passes through the suction filter 25a provided in the first passage 25, thereby cleaning the suction filter 25a, and this is of use in removing clogging.

After the second step is completed, the processing is returned to the first step again and the suction head 21 sucks the workpiece W. During the first step in which the workpiece W is sucked, positive pressure air is gradually supplied into the main passage portion 27b of the third passage 27 through the throttle device 28, and necessary positive pressure P2 for the next second step is accumulated. After the accumulation is completed, the second step is carried out. Therefore, the opening area of the throttle device 28 is extremely minute, and in the second step, this almost does not affect at all when the internal pressure of the first passage 25 and the main passage portion 27b is increased to the releasing pressure instantaneously.

In this manner, only by turning the single two position switching valve 24 ON or OFF, the suction device 20 can transfer the workpiece. Therefore, as compared with the conventional system using the three position type electromagnetic valve, the structure and the control of the system are simplified.

The throttle device 28 and the tank 27a may be provided in a body (not shown) of the switching valve 24. It is not always necessary to provide the tank 27a, and instead a piping volume of the main passage portion 27b may be set to a necessary volume.

As described above, if the workpiece is changed in the suction device, the pressure reducing valve 23b for adjusting the pressure is adjusted in accordance with weight of the workpiece so that the above equation is established, and the positive pressure P2 supplied from the positive pressure source 23 is slightly adjusted or both the negative pressure P1 and the positive pressure P2 are slightly adjusted. The opening area of the throttle device 28 is also adjusted if necessary.

The invention claimed is:

1. A vacuum suction device comprising a suction head for sucking a workpiece, a negative pressure source and a positive pressure source, a single switching valve for selectively connecting the negative pressure source and the positive pressure source to the suction head, a first passage for connecting the switching valve and the suction head with each other, a second passage for connecting the switching valve and the negative pressure source with each other, a third passage for connecting the switching valve and the positive pressure source with each other, and a throttle device provided in the third passage, wherein the switching valve is a two position valve comprising a first switching position which interrupts the third passage and connects the first passage and the second passage with each other, and a second switching position which interrupts the second passage and connects the first passage and the third passage, and wherein a total volume in the first passage is defined as V1, a total volume of a main passage portion from the throttle device in the third passage to the switching valve is defined as V2, a negative pressure in the first passage when the workpiece is sucked by the suction head is defined as P1, a positive pressure of the main passage portion when the workpiece is sucked is defined as P2, and an internal pressure of the first passage and the main passage portion immediately after the switching valve is switched in a state in which the workpiece is sucked by the suction head and the first passage and the third passage are brought into communication with each other is defined as Ps, in the following equation, $$P1 \times V1 + P2 \times V2 = Ps \times (V1 + V2)$$

the pressures P1 and P2, as well as passage volumes V1 and V2 are associated with each other such that the Ps is equal to or less than the atmospheric pressure which is necessary for the workpiece to drop by its own weight from the suction head.

2. A suction device according to claim 1, wherein after the workpiece is released from the suction head, the opening area of the throttle device is adjusted such that the internal pressure Ps of the first passage and the main passage portion becomes a positive pressure which is slightly higher than atmospheric pressure by air flowing through the throttle device.

3. A suction device according to claim 1, wherein a tank for increasing a volume of the main passage portion is connected to the main passage portion of the second passage.

4. A suction device according to claim 2, wherein a tank for increasing a volume of the main passage portion is connected to the main passage portion of the second passage.

5. A suction device according to claim 1, wherein the switching valve is a single solenoid type two position electromagnetic valve.

6. A suction device according to claims 2, wherein the switching valve is a single solenoid type two position electromagnetic valve.

7. A suction device according to claim 1, wherein the first passage is provided with a suction filter.

8. A suction device according to claim 2, wherein the first passage is provided with a suction filter.

9. A suction device according to claim 3, wherein the first passage is provided with a suction filter.

10. A suction device according to claim 4, wherein the first passage is provided with a suction filter.

11. A driving method of a vacuum suction device having a suction head for sucking a workpiece, a negative pressure source and a positive pressure source, a single switching valve for selectively connecting the negative pressure source and the positive pressure source to the suction head, a first passage for connecting the switching valve and the suction head with each other, a second passage for connecting the switching valve and the negative pressure source with each other, a third passage for connecting the switching valve and the positive pressure source with each other, and a throttle device provided in the third passage, wherein the method comprises a first step for connecting the first passage and the second passage by means of the switching valve, thereby sucking the workpiece by the suction head and transporting the workpiece, and a second step for bringing the first passage and the third passage into communication with each other by means of the switching valve, thereby supplying a releasing pressure into the suction head and releasing the workpiece from the suction head, in the second step, a positive pressure charged in a main passage portion extending from a throttle device of the third passage to the switching valve flows into the first passage immediately after the first passage and the third passage are brought into communication with each other by the switching valve, thereby obtaining the releasing pressure, and magnitude of the releasing pressure is set to a value equal to or less than the atmospheric pressure and set to a value which is necessary for the workpiece to drop by its own weight from the suction head; and wherein a total volume in the first passage is defined as V1, a total volume of the main passage portion is defined as V2, a negative pressure in the first passage when the workpiece is sucked by the suction head is defined as P1, a positive pressure of the main passage portion when the workpiece is sucked is defined as P2, and the releasing pressure is defined as Ps, the pressures P1 and P2, as well as passage volumes V1 and V2 are set such that the following equation is established, $$P1 \times V1 + P2 \times V2 = Ps \times (V1 + V2).$$

12. A driving method according to claim 11, wherein after the workpiece is released from the suction head, the opening area of the throttle device is adjusted such that the internal pressure Ps of the first passage and the main passage portion becomes a positive pressure which is slightly higher than atmospheric pressure by air flowing through the throttle device.

13. A driving method of a vacuum suction device having a suction head for sucking a workpiece, a negative pressure source and a positive pressure source, a single switching valve for selectively connecting the negative pressure source and the positive pressure source to the suction head, a first passage for connecting the switching valve and the suction head with each other, a second passage for connecting the switching valve and the negative pressure source with each other, a third passage for connecting the switching valve and the positive pressure source with each other, and a throttle device provided in the third passage, wherein the method comprises a first step for connecting the first passage and the second passage by means of the switching valve, thereby sucking the workpiece by the suction head and transporting the workpiece, and a second step for bringing the first passage and the third passage into communication with each other by means of the switching valve, thereby supplying a releasing pressure into the suction head and releasing the workpiece from the suction head, in the second step, a positive pressure charged in the main passage portion extending from a throttle device of the third passage to the switching valve flows into the first passage immediately after the first passage and the third passage are brought into communication with each other by the switching valve, thereby obtaining the releasing pressure, and magnitude of the releasing pressure is set to a value equal to or less than the atmospheric pressure and set to a value which is necessary for the workpiece to drop by its own weight from the suction head; and wherein after the workpiece is released from the suction head, the opening area of the throttle device is adjusted such that the internal pressure Ps of the first passage and the main passage portion becomes a positive pressure which is slightly higher than atmospheric pressure by air flowing through the throttle device.

* * * * *